(12) United States Patent  (10) Patent No.: US 7,692,299 B2
Nakajima et al.  (45) Date of Patent: Apr. 6, 2010

(54) SEMICONDUCTOR APPARATUS HAVING IMPROVED THERMAL FATIGUE LIFE

(75) Inventors: Chikara Nakajima, Kitaibaraki (JP); Takeshi Kurosawa, Minamisoma (JP); Megumi Mizuno, Minamisoma (JP)

(73) Assignees: Hitachi Haramachi Electronics Co., Ltd. (JP); Hitachi, Ltd. (JP)

( * ) Notice: Subject to any disclaimer, the term of this patent is extended or adjusted under 35 U.S.C. 154(b) by 0 days.

(21) Appl. No.: 11/834,734

(22) Filed: Aug. 7, 2007

(65) Prior Publication Data

US 2008/0036088 A1 Feb. 14, 2008

(30) Foreign Application Priority Data

Aug. 9, 2006 (JP) .............................. 2006-217207

(51) Int. Cl.
*H01L 23/48* (2006.01)
*H01L 23/02* (2006.01)
*H01L 23/049* (2006.01)
*H01L 23/28* (2006.01)
*H01L 23/31* (2006.01)

(52) U.S. Cl. ............ 257/747; 257/E23.11; 257/E23.14; 257/E23.017; 257/E23.125; 257/E23.186; 257/E23.187; 257/719; 257/718; 257/727; 257/772; 257/712; 257/720; 257/688; 257/689; 257/693; 257/658; 257/732; 257/699

(58) Field of Classification Search ................. 257/747, 257/E23.11, E23.017, 719, 718, 727, E23.125, 257/E23.186, 772, 712, 720, 688, 689, 693, 257/658, E23.187, 699, 732; 438/117
See application file for complete search history.

(56) References Cited

U.S. PATENT DOCUMENTS

| | | | | |
|---|---|---|---|---|
| 4,278,990 | A * | 7/1981 | Fichot | 257/747 |
| 6,331,730 | B1 * | 12/2001 | Terasaki et al. | 257/688 |
| 7,061,090 | B2 * | 6/2006 | Yamazaki et al. | 257/688 |
| 7,528,489 | B2 * | 5/2009 | Kajiwara et al. | 257/772 |
| 2002/0011661 | A1 * | 1/2002 | Terasaki et al. | 257/719 |
| 2007/0182023 | A1 * | 8/2007 | Hiramitsu et al. | 257/778 |
| 2007/0228534 | A1 * | 10/2007 | Uno et al. | 257/678 |
| 2007/0231963 | A1 * | 10/2007 | Doan et al. | 438/107 |
| 2007/0262387 | A1 * | 11/2007 | Nonaka et al. | 257/356 |

FOREIGN PATENT DOCUMENTS

JP 2005-340267 12/2005

* cited by examiner

*Primary Examiner*—Alexander O Williams
(74) *Attorney, Agent, or Firm*—Antonelli, Terry, Stout & Kraus, LLP.

(57) ABSTRACT

A semiconductor apparatus having improved thermal fatigue life is provided by lowering maximum temperature on jointing members and reducing temperature change. A jointing member is placed between a semiconductor chip and a lead electrode, and a thermal stress relaxation body is arranged between the chip and a support electrode. Jointing members are placed between the thermal stress relaxation body and the chip and between the thermal stress relaxation body and the support electrode. A second thermal stress relaxation body made from a material having a thermal expansion coefficient between the coefficients of the chip and the lead electrode is located between the chip and the lead electrode. The first thermal stress relaxation body is made from a material which has a thermal expansion coefficient in between the coefficients of the chip and the support electrode, and has a thermal conductivity of 50 to 300 W/(m·° C.).

11 Claims, 3 Drawing Sheets

SEMICONDUCTOR APPARATUS HAVING IMPROVED THERMAL FATIGUE LIFE

BACKGROUND OF THE INVENTION

The present invention relates to a semiconductor apparatus which is used in an AC-DC converter that converts an alternating-current power into a direct-current power, and in particular, to a semiconductor apparatus for automotive use, which is used in the AC-DC converter that converts the alternating-current power output from an alternator into the direct-current power and strongly requires the long thermal fatigue life against the change of a temperature to the semiconductor apparatus.

A semiconductor apparatus used in an AC-DC converter for automotive use inhibits a semiconductor chip composing the AC-DC converter from raising its temperature when converting an alternating-current power output from an alternator into a direct-current power, by radiating heat generated in the semiconductor chip mainly through a radiator plate.

In recent years, a 20° C. higher operating temperature has been required to an alternator for automotive use than a request value of about 180° C. for the conventional use operating temperature. When a semiconductor apparatus used in the AC-DC converter is operated under such a high operating temperature, the thermal fatigue life of the semiconductor apparatus may end in comparatively short thermal fatigue life cycle times.

For this reason, JP-A-2005-340267 discloses a technology on a semiconductor apparatus which is used in an AC-DC converter for automotive use, prevents a semiconductor element from causing a crack in a cooling step after joint assembly or a thermal shock test, and shows the superior thermal fatigue life which is caused by the repeated passing/interception of an electric current to/against the semiconductor element. The semiconductor apparatus has a configuration of: making a thin sheet member with low thermal expansion made from a clad material of Cu/Fe—Ni alloy/Cu having a thermal expansion coefficient of 10 PPM ($10 \times 10^{-6}$ (1/° C.)) or lower inserted between the semiconductor element and both of electrode terminals through jointing members respectively, as a stress relaxation material; and forming the thin sheet member with low thermal expansion so that the outline dimension in a lead electrode terminal side can be smaller than that of an electrode face of the semiconductor element, and the outline dimension in a base electrode terminal side can be larger than that of an electrode face of the semiconductor element.

However, a semiconductor apparatus which has a configuration disclosed in JP-A-2005-340267 and used in an AC-DC converter for automotive use has had a problem that the thermal fatigue life of a jointing member ends in a comparatively few thermal fatigue life cycle times and the thermal fatigue life of the semiconductor apparatus ends in a comparatively short period, because the jointing member has a thermal expansion coefficient greatly different from those of a semiconductor chip, a lead electrode and a support electrode, and the jointing member that joints the semiconductor chip is exposed to a high maximum temperature and receives a great temperature change, which generates heat when converting an alternating-current power output from an alternator into a direct-current power.

An object of the present invention is to provide a semiconductor apparatus which is provided with a semiconductor chip used in an AC-DC converter that converts an alternating-current power to a direct-current power, effectively transfers heat generated in the semiconductor chip to a support electrode to radiate the heat, lowers the maximum temperature on a jointing member existing between a semiconductor element and an electrode terminal, reduces the width of the temperature change, and thereby improves the thermal fatigue life against the temperature change.

SUMMARY OF THE INVENTION

A semiconductor apparatus according to the present invention is provided with a semiconductor chip, a lead electrode and a support electrode; has a second thermal stress relaxation body arranged between the semiconductor chip and the lead electrode, has jointing members respectively placed between the second thermal stress relaxation body and the semiconductor chip and between the second thermal stress relaxation body and the lead electrode, and makes the second thermal stress relaxation body connected to the lead electrode; has a first thermal stress relaxation body arranged between the semiconductor chip and the support electrode, has jointing members respectively placed between the first thermal stress relaxation body and the semiconductor chip and between the first thermal stress relaxation body and the support electrode, and makes the first thermal stress relaxation body connected to the support electrode; wherein the second thermal stress relaxation body is made from a material which has a thermal expansion coefficient in between the thermal expansion coefficients of the semiconductor chip and the lead electrode, and the first thermal stress relaxation body is made from a material which has a thermal expansion coefficient in between the thermal expansion coefficients of the semiconductor chip and the support electrode and has a thermal conductivity of 50 to 300 W/(m·° C.).

Another semiconductor apparatus according to the present invention is provided with a semiconductor chip, a lead electrode and a support electrode; has a jointing member placed in between the semiconductor chip and the lead electrode to joint the semiconductor chip with the lead electrode; has a first thermal stress relaxation body arranged between the semiconductor chip and the support electrode, has jointing members respectively placed between the first thermal stress relaxation body and the semiconductor chip and between the first thermal stress relaxation body and the support electrode, and makes the first thermal stress relaxation body connected to the support electrode, wherein the first thermal stress relaxation body is made from a material which has a thermal expansion coefficient in between the thermal expansion coefficients of the semiconductor chip and the support electrode and has a thermal conductivity of 50 to 300 W/(m·° C.).

The present invention can realize a semiconductor apparatus which is provided with a semiconductor chip used in an AC-DC converter that converts an alternating-current power to a direct-current power, effectively transfers heat generated in the semiconductor chip to a support electrode to radiate the heat, lowers the maximum temperature on a jointing member existing between a semiconductor element and an electrode terminal, reduces the width of the temperature change, and thereby improves the thermal fatigue life against the temperature change.

Other objects, features and advantages of the invention will become apparent from the following description of the embodiments of the invention taken in conjunction with the accompanying drawings.

DESCRIPTION OF REFERENCE NUMERALS

Figure 1:
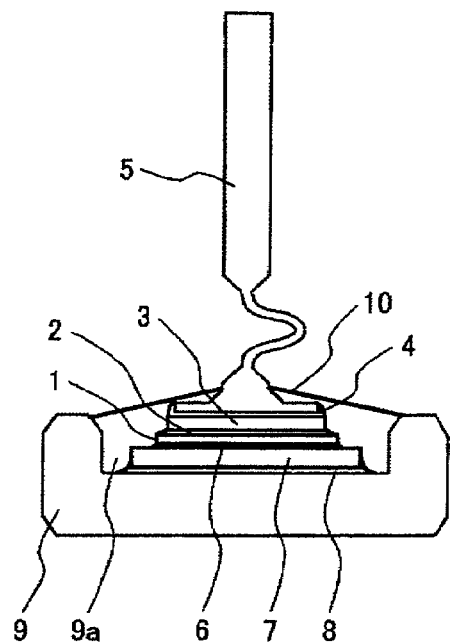
FIG. 1 is a sectional view showing a semiconductor apparatus for automotive use, according to an embodiment of the present invention.

1: semiconductor chip
2, 4, 6 and 8: jointing members
3: second thermal stress relaxation body
5: lead electrode
7 and 7b: first thermal stress relaxation bodies
9: support electrode
10: surface insulating silicone rubber
11: lead wire
12: cooling plate

DETAILED DESCRIPTION OF THE INVENTION

A semiconductor apparatus according to an embodiment of the present invention will be explained with reference to the drawings, which is used in an AC-DC converter that converts an alternating-current power output from an alternator to a direct-current power.

EMBODIMENT 1

FIG. 1 is a view showing a structure of a semiconductor apparatus for automotive use according to an embodiment of the present invention, which is used in an AC-DC converter that converts an alternating-current power output from an alternator to a direct-current power.

In FIG. 1, a semiconductor apparatus according to the present embodiment is a semiconductor apparatus for automotive use, which is used in an AC-DC converter that converts an alternating-current power to a direct-current power, and has a configuration of having a semiconductor chip 1 that converts the alternating-current power to the direct-current power, having a second thermal stress relaxation body 3 made from a molybdenum material having a thermal expansion coefficient of 3 to $9\times10^{-6}$ (1/° C.) in between the coefficients of the semiconductor chip 1 and a lead electrode 5, arranged between the upper part of the semiconductor chip 1 and the lead electrode 5, and making a jointing member 2 joint the second thermal stress relaxation body 3 to the semiconductor chip 1.

The second thermal stress relaxation body 3 is made from a molybdenum material selected among materials because of having a thermal expansion coefficient of 3 to $9\times10^{-6}$ (1/° C.) which is in between the thermal expansion coefficient of $3\times10^{-6}$ /° C. of the semiconductor chip 1 and the thermal expansion coefficient of $17.7\times10^{-6}$ /° C. of the lead electrode 5, and thereby alleviates a difference between thermal expansions occurring in both of the semiconductor chip 1 and the lead electrode 5 due to the heat generated in the semiconductor chip 1 composing an AC-DC converter that converts a three-phase alternating-current to a direct-current power.

The semiconductor apparatus according to the present embodiment has the configuration of further having a first thermal stress relaxation body 7 arranged between a lower part of the semiconductor chip 1 and the support electrode 9, which is jointed with the semiconductor chip 1 by a jointing member 6, and is made from a material having a thermal expansion coefficient of 5 to $11\times10^{-6}$ (1/° C.) that is a value between the coefficients of a semiconductor chip 1 and a support electrode 9 and having a conductivity of 50 to 300 W/(m·° C.).

The first thermal stress relaxation body 7 is made from a clad material containing 35% copper and the balance being molybdenum selected among materials because the clad material has a thermal expansion coefficient of 5 to $11\times10^{-6}$ (1/° C.) which is in between the thermal expansion coefficient of $3\times10^{-6}$ /° C. of the semiconductor chip 1 and the thermal expansion coefficient of $17.7\times10^{-6}$ /° C. of the support electrode 9, and thereby alleviates a difference between thermal expansions occurring in both of the semiconductor chip 1 and the support electrode 9 due to the heat generated in the semiconductor chip 1 composing an AC-DC converter that converts a three-phase alternating-current to a direct-current power.

Furthermore, a clad material containing 35% copper and the balance being molybdenum used in the first thermal stress relaxation body 7 is designed to have a thermal conductivity of 50 to 300 W/(m·° C.) in addition to the above described thermal expansion coefficient, and thereby makes a semiconductor chip 1 composing an AC-DC converter that converts a three-phase alternating-current into a direct-current power to effectively transfer heat generated in the semiconductor chip 1 to a support electrode 9 having a large heat capacity through the thermal stress relaxation body 7 and consequently to promote the radiation of the heat.

The semiconductor apparatus according to the present embodiment has a lead electrode 5 arranged on an upper part of a semiconductor chip 1, which is connected to a second thermal stress relaxation body 3 further through a jointing member 4 that is placed between the upper part of the second thermal stress relaxation body 3 which is connected to the jointing member 2, and the lead electrode 5; and has a support electrode 9 arranged in a lower part of the semiconductor chip 1, which is connected to a first thermal stress relaxation body 7 further through a jointing member 8 that is placed between the lower part of the first thermal stress relaxation body 7 which is connected to the jointing member 6, and the support electrode 9.

The above lead electrode 5 and the support electrode 9 are components for passing an electric power to a semiconductor chip 1 composing an AC-DC converter that converts a three-phase alternating-current into a direct-current power.

The semiconductor apparatus according to the present embodiment has a configuration in which the support electrode body 9 has a recess 9a with a sunken shape formed in its central part, makes a first thermal stress relaxation body 7 jointed to the bottom of the recess 9a of the support electrode 9 through a jointing member 8, and then sequentially stacks a second thermal stress relaxation body 3, a semiconductor chip 1 and the first thermal stress relaxation body 7 respectively through jointing members 4, 2, 6 and 8 on the inside of the recess 9a of the support electrode 9 to accommodate them.

The recess 9a of the support electrode 9 thus accommodates the second thermal stress relaxation body 3, the semiconductor chip 1 and the first thermal stress relaxation body 7 therein, and is filled with silicone rubber 10 in the inner part. Thus, the silicone rubber 10 seals the second thermal stress relaxation body 3, the semiconductor chip 1 and the first thermal stress relaxation body 7 which are accommodated in the recess 9a, and thereby protects the surface of the semiconductor chip 1.

Jointing members 2, 4, 6 and 8 employ a solder (Pb—Sn-based solder or Sn—Cu-based solder) with a melting point of about 300° C. and improves thermal fatigue characteristics of a semiconductor apparatus for automotive use, which is used under a temperature condition of 150° C. or higher.

The jointing members 2, 4, 6 and 8 may employ another composition of solder (such as Sn—Ag-based, Sn—Zn-based and Au—Sn-based solder) in place of the solder with the above described composition, or an electroconductive resin, as the material. In this case, the solder with the other composition or the electroconductive resin preferably has a melting point of about 230° C. or higher.

Incidentally, the thermal fatigue life Nf and solder strain $\Delta\epsilon p$ caused by a temperature change occurring in the solder to be used for jointing members 2, 4, 6 and 8 to be used in a semiconductor apparatus according to the present embodiment have the following relational expression:

$$Nf=K/\Delta\epsilon^n \qquad (1)$$

wherein K and n are constants determined by a material of a solder, an environment and a temperature; and $\Delta\epsilon p$ represents an amplitude of a plastic strain in solder.

When considering the influence of a difference between coefficients of thermal expansion generated by a temperature fluctuation on the strain and the influences of a frequency of the temperature fluctuation and the maximum temperature on a micro crack propagation speed in a thermal fatigue life test, the above described expression (1) is dilated into the following expression (2):

$$Nf=C \cdot f \cdot (L \cdot \Delta\alpha \cdot \Delta T/2h)^{-n} \exp(Ea/kT\text{max}) \qquad (2)$$

wherein C, $\lambda$ and n are constants; f represents a temperature repetition frequency; L represents a solder length; $\Delta\alpha$ represents a difference between thermal expansions of members; $\Delta T$ represents a range of temperature change applied to solder; h represents a thickness of solder; Ea represents activation energy; k represents a Boltzmann constant; and Tmax represents the maximum temperature.

It is understood from the expression (2) that the thermal fatigue life of solder is improved by reducing the difference between thermal expansions $\Delta\alpha$ of members, the range of temperature change $\Delta T$ applied to solder and the maximum temperature Tmax.

Both of a high maximum temperature Tmax and a large range of temperature change $\Delta T$ are applied to solders of a jointing member 2 and a jointing member 6 which are used in a semiconductor apparatus, because a lead electrode 5 and a support electrode 9 have such a large difference $\Delta\alpha$ between thermal expansions of the respective members and a semiconductor chip 1 composing an AC-DC converter as to be $14.7\times10^{-6}$ /° C. which is the difference between a thermal expansion coefficient of $3\times10^{-6}$ /° C. of the semiconductor chip 1 and a thermal expansion coefficient of $17.7\times10^{-6}$ /° C. of themselves, and further are connected to the semiconductor chip 1 which generates heat when converting an alternating-current power output from an alternator into a direct-current power. Accordingly, the jointing member 2 and the jointing member 6 reach the limit of use after such a comparatively few cycle times as about 8,500 cycles in a thermal fatigue life tests, and the semiconductor apparatus provided with such a semiconductor chip composing an AC-DC converter cannot endure for a long period of use in automobiles.

For this reason, a semiconductor apparatus according to the present embodiment reduces a range of temperature change $\Delta T$ and lowers the maximum temperature Tmax which originate in the heat generated in a semiconductor chip 1 and affect on jointing members 6 and 8, by providing a first thermal stress relaxation body 7 that is arranged between a lower part of the semiconductor chip 1 composing an AC-DC converter and a support electrode body 9, is connected to the semiconductor chip 1 and the support electrode 9 respectively through the jointing members 6 and 8, and is made from a clad material containing 35% copper and the balance being molybdenum, which has a thermal expansion coefficient of 5 to $11\times10^{-6}$ (1/° C.) that is a value between the coefficients of the semiconductor chip 1 and the support electrode 9, and has a thermal conductivity of 50 to 300 W/(m·° C.).

Furthermore, the semiconductor apparatus effectively radiates the heat generated in the semiconductor chip 1 composing an AC-DC converter by effectively transferring the generated heat to a support electrode 9 having large heat capacity through a first thermal stress relaxation body 7 having improved thermal conductivity, and accordingly can improve the thermal fatigue life Nf of the semiconductor apparatus, because the first thermal stress relaxation body 7 arranged between the semiconductor chip 1 and the support electrode 9 is controlled so as to have a thermal conductivity of 50 to 300 W/(m·° C.) by employing a composite material containing 35% copper and the balance being molybdenum.

The semiconductor apparatus is also provided with a second thermal stress relaxation body 3 in between the upper part of the semiconductor chip 1 and a lead electrode 5, in which the relaxation body 3 is connected to the semiconductor chip 1 and the lead electrode 5 through a jointing member 2 and a jointing member 4, and thereby can improve the thermal fatigue life Nf, because the second thermal stress relaxation body 3 employs a molybdenum material having a thermal expansion coefficient of 3 to $9\times10^{-6}$ (1/° C.) which is a value in between the coefficients of the semiconductor chip 1 and the lead electrode 5, and thus reduces a difference $\Delta\alpha$ between thermal expansion coefficients of the lead electrode 5 and the semiconductor chip 1 that generates heat and affects on the jointing member 2 and the jointing member 4 which respectively exist between the lower part and upper part of the second thermal stress relaxation body 3.

When employing a clad material containing 35% copper and the balance being molybdenum having a thermal conductivity of 210 W/(m·° C.) and a thermal expansion coefficient, for instance, of $7.7\times10^{-6}$ (1/° C.) which is a value in between the coefficients of the semiconductor chip 1 and a support electrode 9 for the material, the first thermal stress relaxation body 7 can decrease a range of temperature change $\Delta T$ and lower a maximum temperature Tmax by about 14° C. compared to the first thermal stress relaxation body 7 having employed a clad material of copper/Fe—Ni alloy/copper, which originate in the heat generated in the semiconductor chip 1 and affect on a jointing member 6 and a jointing member 8.

Figure 5:
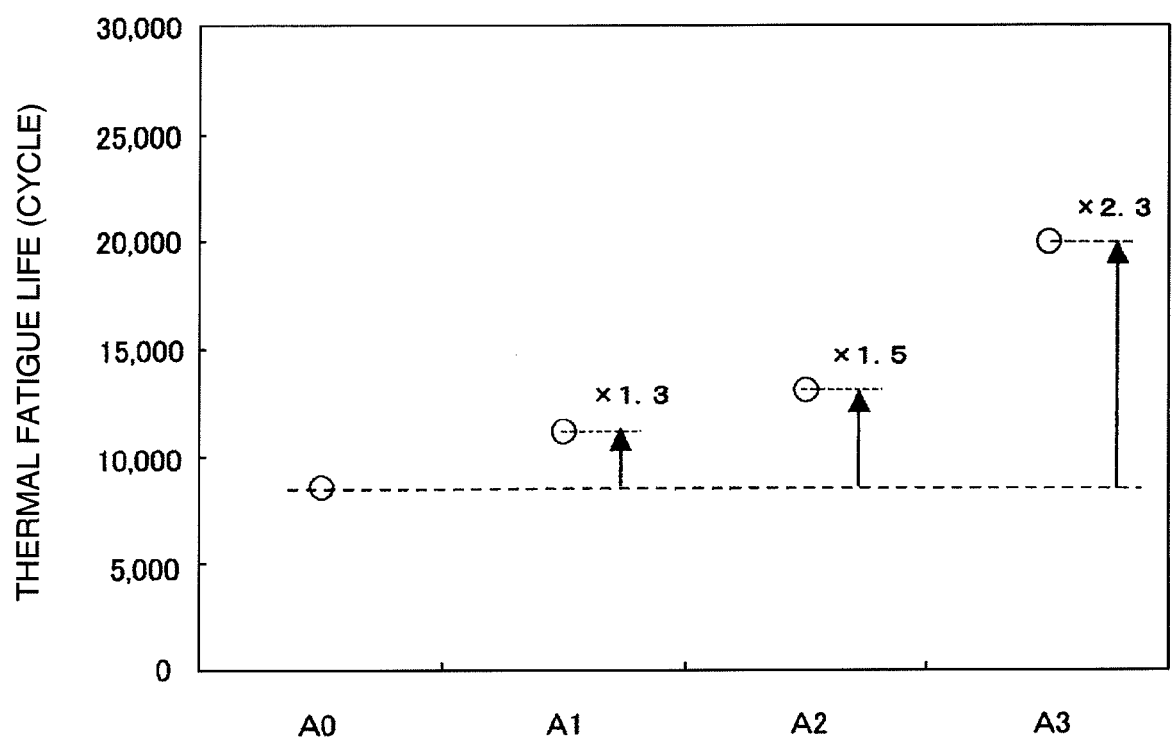
FIG. 5 is a stress analysis view showing an average life cycle obtained by having conducted a simulating thermal fatigue life test with the use of a semiconductor apparatus according to each embodiment of the present invention.

FIG. 5 is a view illustrating stress analysis data showing average life cycles of semiconductor apparatuses obtained from a simulated thermal fatigue life test, each of which is provided with a second thermal stress relaxation body 3 and/or a first thermal stress relaxation body 7 respectively using any of various materials, and a semiconductor chip 1 composing an AC-DC converter.

In FIG. 5, a datum on A0 shows an analysis result of a thermal fatigue life test on a semiconductor apparatus having the same configuration as in a conventional product, which has only a thermal stress relaxation body using a clad material of copper/Fe—Ni alloy/copper arranged in between a semiconductor chip 1 composing an AC-DC converter and a support electrode 9, and shows that an average life cycle of a semiconductor apparatus is barely about 8,500 cycles.

Figure 3:
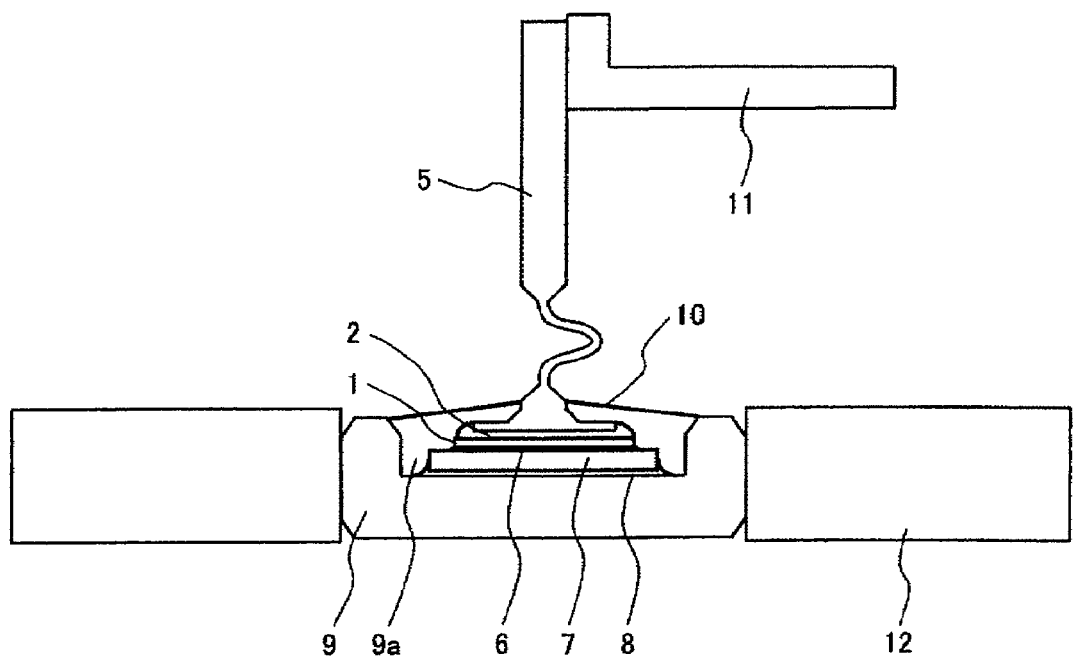
FIG. 3 is a sectional view showing a semiconductor apparatus connected to an alternator for automotive use, according to another embodiment of the present invention.

In contrast to this, a datum on A1 in FIG. 5 shows an analysis result of a thermal fatigue life test on a semiconductor apparatus having a configuration according to the embodiment shown in FIG. 3, which has only the first thermal stress relaxation body 7 using a clad material containing 35% copper and the balance being molybdenum having a thermal expansion coefficient of 5 to $11 \times 10^{-6}$ (1/° C.) that is a value between the coefficients of a semiconductor chip 1 and a support electrode 9 and having a conductivity of 50 to 300 W/(m·° C.), arranged between the semiconductor chip 1 composing an AC-DC converter and the support electrode 9, and shows that an average life cycle is about 11,000 cycles.

An average life cycle in a semiconductor apparatus according to the embodiment of A1 is even about 1.3 times improved when compared to that of the semiconductor apparatus of A0.

Figure 4:
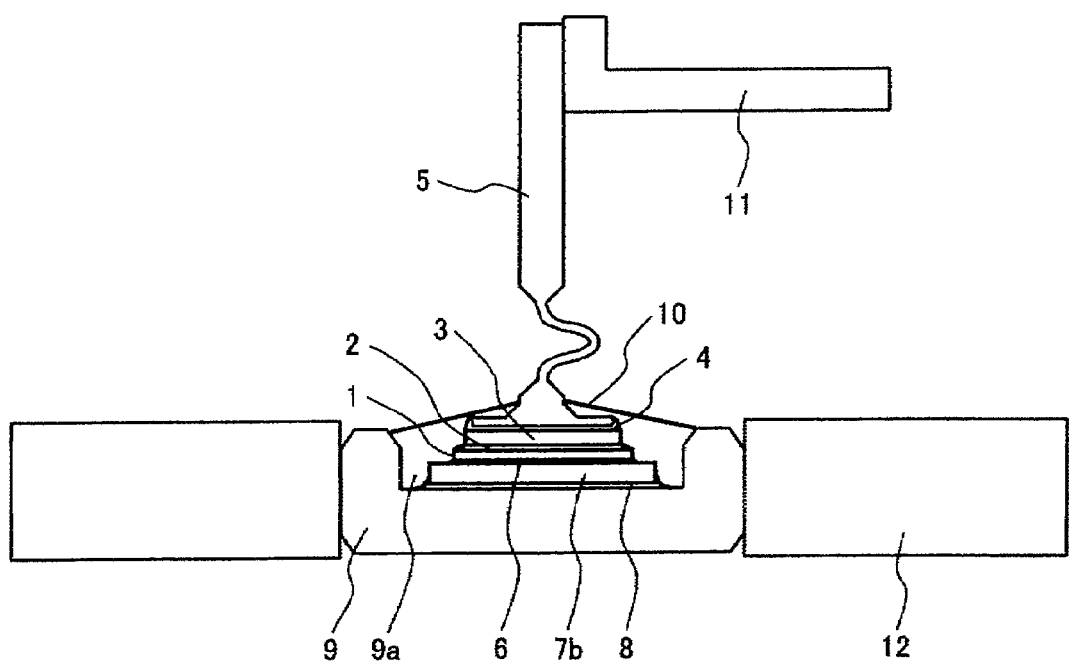
FIG. 4 is a sectional view showing a semiconductor apparatus connected to an alternator for automotive use, according to another embodiment of the present invention.

In addition, a datum on A2 in FIG. 5 shows an analysis result of a thermal fatigue life test on a semiconductor apparatus having a configuration according to the embodiment shown in FIG. 4, which has the semiconductor chip 1 composing an AC-DC converter, a second thermal stress relaxation body 3 using a molybdenum material having a thermal expansion coefficient of 3 to $9 \times 10^{-6}$ (1/° C.) that is a value in between the coefficients of the semiconductor chip 1 and a lead electrode 5, arranged between the semiconductor chip 1 and the lead electrode 5, and further has a first thermal stress relaxation body 7 using a clad material of copper/Fe—Ni alloy/copper having a thermal expansion coefficient of 5 to $11 \times 10^{-6}$(1/° C.) that is a value between the coefficients of the semiconductor chip 1 and the support electrode 9 and having a conductivity of 50 to 300 W/(m·° C.), arranged between the semiconductor chip 1 composing an AC-DC converter and the support electrode 9, and shows that the average life cycle is about 13,000 cycles.

An average life cycle in a semiconductor apparatus according to the embodiment of A2 is even about 1.5 times improved when compared to that of the semiconductor apparatus of A0.

In addition, a datum on A3 in FIG. 5 shows an analysis result of a thermal fatigue life test on a semiconductor apparatus having a configuration according to the embodiment shown in FIG. 1, which has a semiconductor chip 1 composing an AC-DC converter, a second thermal stress relaxation body 3 using a molybdenum material having a thermal expansion coefficient of 3 to $9 \times 10^{-6}$ (1/° C.) that is a value in between the coefficients of the semiconductor chip 1 and a lead electrode 5, arranged between the semiconductor chip 1 and the lead electrode 5, and further has a first thermal stress relaxation body 7 using a clad material containing 35% copper and the balance being molybdenum having a thermal expansion coefficient of 5 to $11 \times 10^{-6}$ (1/° C.) that is a value between the coefficients of the semiconductor chip 1 and a support electrode 9 and having a conductivity of 50 to 300 W/(m·° C.), arranged between the semiconductor chip 1 and the support electrode 9, and shows that the average life cycle is about 20,000 cycles.

An average life cycle in a semiconductor apparatus according to the embodiment of A3 is even about 2.3 times improved when compared to that of the semiconductor apparatus of A0.

It was revealed from a stress analysis result of a simulated thermal fatigue life test on semiconductor apparatuses according to respective embodiments of the present invention shown in FIG. 5 that a second thermal stress relaxation body 3 using a molybdenum material having a thermal expansion coefficient of 3 to $9 \times 10^{-6}$ (1/° C.) improves the thermal fatigue life of the semiconductor apparatus.

In addition, it was revealed that a first thermal stress relaxation body 7 improves the thermal fatigue life of a semiconductor apparatus when employing such molybdenum, a clad material of molybdenum and copper (copper ratio of 10% to 80%) or a clad material of copper/Fe—Ni alloy/copper as to have a thermal expansion coefficient of 5 to $11 \times 10^{-6}$(1/° C.) and a conductivity of 50 to 300 W/(m·° C.).

The result of a thermal fatigue life test on a semiconductor apparatus provided with a semiconductor chip 1 composing an AC-DC converter shown in FIG. 5 shows that the thermal fatigue life cycles of the semiconductor apparatuses in the respective examples shown in A1, A2 and A3 according to the present invention are largely extended to about 11,000 cycles, about 13,000 cycles and about 20,000 cycles in comparison with about 8,500 cycles of a conventional product and the life is extended about 1.3 times to about 2.3 times by a ratio with respect to the value of the conventional product.

As is clear from the above description, the present embodiment described above can realize a semiconductor apparatus which is provided with a semiconductor chip used in an AC-DC converter that converts an alternating-current power to a direct-current power, effectively transfers heat generated in the semiconductor chip to a support electrode to radiate the heat, lowers the maximum temperature on a jointing member existing between a semiconductor element and an electrode terminal, reduces the range of the temperature change, and thereby improves the thermal fatigue life against the temperature change.

EMBODIMENT 2

Figure 2:
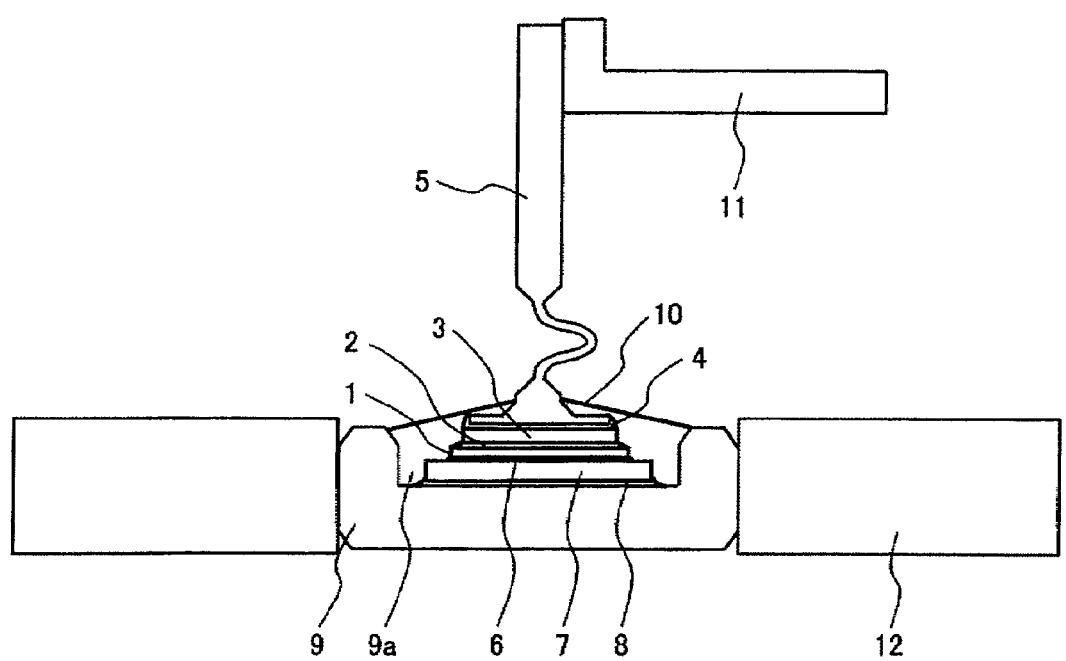
FIG. 2 is a sectional view showing a semiconductor apparatus connected to an alternator for automotive use, according to another embodiment of the present invention.

FIG. 2 is a view showing a structure of a semiconductor apparatus for automotive use according to another embodiment of the present invention, which is provided with a semiconductor chip 1 composing an AC-DC converter that converts an alternating-current power output from an alternator to a direct-current power.

A semiconductor apparatus according to the present embodiment shown in FIG. 2 is a semiconductor apparatus for automotive use, specifically is connected to a power source, for instance, to an alternator of an automobile, but basically has the same structure as in the semiconductor apparatus of the previous embodiment shown in FIG. 1. Accordingly, the description on the common configuration will be omitted, and only the different part will be described.

A semiconductor apparatus according to the present embodiment shown in FIG. 2 has a configuration of connecting a semiconductor chip 1 used in an AC-DC converter with a lead electrode 5 through a lead wire 11 for passing an electric power and connecting a radiator plate 12 with a support electrode 9. The other structure of the semiconductor apparatus is the same one as in the semiconductor apparatus according to the embodiment shown in FIG. 1, which has both of a second thermal stress relaxation body 3 and a first thermal stress relaxation body 7 as the thermal stress relaxation body.

A semiconductor apparatus according to the present embodiment having the above described configuration alleviates a difference between thermal expansions occurring in both of the semiconductor chip 1 and the lead electrode 5 due to the heat generated in the semiconductor chip 1 composing an AC-DC converter that converts a three-phase alternating-current to a direct-current power, through the provision of a second thermal stress relaxation body 3 using a molybdenum material having a thermal expansion coefficient of 3 to $9 \times 10^{-6}$ (1/° C.) that is a value between the coefficients of the semiconductor chip 1 and the lead electrode 5 thereby to reduce a range of temperature change ΔT and lower the maximum temperature Tmax which originate in the heat generated in the semiconductor chip 1 and affect on a jointing member 2 and a jointing member 4.

Furthermore, the semiconductor apparatus reduces a range of temperature change ΔT and lowers the maximum temperature Tmax which originate in the heat generated in a semiconductor chip 1 and affect on a jointing member 6 and a jointing member 8, through the provision of a first thermal stress relaxation body 7 having a thermal expansion coefficient of 5 to $11 \times 10^{-6}$ (1/° C.) that is a value between the coefficients of the semiconductor chip 1 and a support electrode 9, in between the semiconductor chip 1 and the support electrode 9.

Besides, the thermal stress relaxation body 7 has a conductivity 50 to 300 W/(m·° C.), thereby effectively transfers the heat generated in the semiconductor chip 1 composing an AC-DC converter to the support electrode 9 having a large heat capacity, and effectively promotes the radiation of the heat.

Thus, the semiconductor apparatus can greatly improve the thermal fatigue life Nf through the provision of the thermal stress relaxation body 7 having the above described thermal expansion coefficient and thermal conductivity therein.

The present embodiment also can realize a semiconductor apparatus which is provided with a semiconductor chip used in an AC-DC converter that converts an alternating-current power to a direct-current power, effectively transfers heat generated in the semiconductor chip to a support electrode to radiate the heat, lowers the maximum temperature on a jointing member existing between a semiconductor element and an electrode terminal, reduces the range of the temperature change, and thereby improves the thermal fatigue life against the temperature change.

EMBODIMENT 3

FIG. 3 is a view showing a structure of a semiconductor apparatus for automotive use according to another embodiment of the present invention, which is provided with a semiconductor chip 1 composing an AC-DC converter that converts an alternating-current power output from an alternator to a direct-current power.

The semiconductor apparatus according to the present embodiment shown in FIG. 3 has basically the same structure as in the semiconductor apparatus of the previous embodiment shown in FIG. 1. Accordingly, the description on the common configuration will be omitted, and only the different part will be described.

A semiconductor apparatus according to the present embodiment shown in FIG. 3 has a configuration having the first thermal stress relaxation body 7 as the thermal stress relaxation body and no second thermal stress relaxation body 3. The other structure of the semiconductor apparatus is the same as in the semiconductor apparatus shown in FIG. 1.

Specifically, the semiconductor apparatus has a semiconductor chip 1 connected to a lead electrode 5 by a jointing member 2, and is not provided with a thermal stress relaxation body in between the semiconductor chip 1 and the lead electrode 5 but provided with a first thermal stress relaxation body 7 using a clad material containing 35% copper and the balance being molybdenum, which has a thermal expansion coefficient of 5 to $11 \times 10^{-6}$ (1/° C.) which is a value between the coefficients of the semiconductor chip 1 and a support electrode 9, and has a conductivity of 50 to 300 W/(m·° C.), only in between the semiconductor chip 1 and the support electrode 9 through the jointing members 6 and 8.

A semiconductor apparatus according to the present embodiment having the above described configuration alleviates a difference between thermal expansions occurring in both of the semiconductor chip 1 and the support electrode 9 due to the heat generated in the semiconductor chip 1 composing an AC-DC converter that converts a three-phase alternating-current to a direct-current power, through the provision of a first thermal stress relaxation body 7 having a thermal expansion coefficient of 5 to $11 \times 10^{-6}$ (1/° C.) that is a value in between the coefficients of the semiconductor chip 1 and the support electrode 9 thereby to reduce a range of temperature change ΔT and lower the maximum temperature Tmax which originate in the heat generated in the semiconductor chip 1 and affect on a jointing member 6 and a jointing member 8.

Furthermore, the thermal stress relaxation body 7 has a conductivity of 50 to 300 W/(m·° C.), thereby effectively transfers the heat generated in the semiconductor chip 1 composing an AC-DC converter to the support electrode 9 having a large heat capacity, and effectively promotes the radiation of the heat.

Thus, the semiconductor apparatus can greatly improve the thermal fatigue life Nf through the provision of the thermal stress relaxation body 7 having the above described thermal expansion coefficient and thermal conductivity therein.

The present embodiment also can realize a semiconductor apparatus which is provided with a semiconductor chip used in an AC-DC converter that converts an alternating-current power to a direct-current power, effectively transfers heat generated in the semiconductor chip to a support electrode to radiate the heat, lowers the maximum temperature on a jointing member existing in between a semiconductor element and an electrode terminal, reduces the range of the temperature change, and thereby improves the thermal fatigue life against the temperature change.

EMBODIMENT 4

FIG. 4 is a view showing a structure of a semiconductor apparatus for automotive use according to further another embodiment of the present invention, which is provided with a semiconductor chip 1 composing an AC-DC converter that converts an alternating-current power output from an alternator to a direct-current power.

The semiconductor apparatus according to the present embodiment shown in FIG. 4 has basically the same structure as in the semiconductor apparatus of the previous embodiment shown in FIG. 1. Accordingly, the description on the common configuration will be omitted, and only the different part will be described.

A semiconductor apparatus according to the present embodiment shown in FIG. 4 has a configuration having a second thermal stress relaxation body 3 and a first thermal stress relaxation body 7b made of a clad material of copper/Fe—Ni alloy/copper as the thermal stress relaxation body. The other structure of the semiconductor apparatus is the same as in the semiconductor apparatus shown in FIG. 1.

Specifically, the semiconductor apparatus according to the present embodiment alleviates a difference between thermal expansions occurring in both of the semiconductor chip 1 and the lead electrode 5 due to the heat generated in the semiconductor chip 1 composing an AC-DC converter, through the provision of a second thermal stress relaxation body 3 using a molybdenum material having a thermal expansion coefficient of 3 to $9 \times 10^6$ (1/° C.) that is a value between the coefficients of the semiconductor chip 1 and the lead electrode 5 thereby to reduce a range of temperature change ΔT and lower the maximum temperature Tmax which originate in the heat generated in the semiconductor chip 1 and affect a jointing member 2 and a jointing member 4.

The semiconductor apparatus according to the present embodiment further has a first thermal stress relaxation body 7 using a clad material of copper/Fe—Ni alloy/copper arranged in between the semiconductor chip 1 and the support electrode 9, which has a thermal expansion coefficient of 5 to $11 \times 10^{-6}$ (1/° C.) that is a value between the coefficients of the semiconductor chip 1 and the support electrode 9 and has a conductivity of 50 to 300 W/(m·° C.).

The first thermal stress relaxation body 7 can be prepared so as to have a thermal expansion coefficient of 5 to $11 \times 10^{-6}$ (1/° C.) and a conductivity of 50 to 300 W/(m·° C.) of desired characteristic values, by changing a thickness ratio of respective metals in a used clad material of copper/Fe—Ni alloy/copper.

The semiconductor apparatus reduces a range of temperature change ΔT and lowers the maximum temperature Tmax which originate in the heat generated in a semiconductor chip 1 and affect on a jointing member 6 and a jointing member 8, through the provision of a first thermal stress relaxation body 7 having a thermal expansion coefficient of 5 to $11 \times 10^{-6}$ (1/° C.), in between the semiconductor chip 1 and a support electrode 9.

Furthermore, the first thermal stress relaxation body 7 is designed to have a thermal conductivity of 50 to 300 W/(m·° C.) in addition to the above described thermal expansion coefficient, and thereby makes a semiconductor chip 1 composing an AC-DC converter that converts a three-phase alternating-current into a direct-current power to effectively transfer heat generated in the semiconductor chip 1 to a support electrode 9 having a large heat capacity through the thermal stress relaxation body 7 and consequently to promote the radiation of the heat.

Thus, the semiconductor apparatus can greatly improve the thermal fatigue life Nf through the provision of the thermal stress relaxation body 7 having the above described thermal expansion coefficient and thermal conductivity therein.

The present embodiment also can realize a semiconductor apparatus which is provided with a semiconductor chip used in an AC-DC converter that converts an alternating-current power to a direct-current power, effectively transfers heat generated in the semiconductor chip to a support electrode to radiate the heat, lowers the maximum temperature on a jointing member existing in between a semiconductor element and an electrode terminal, reduces the range of the temperature change, and thereby improves the thermal fatigue life against the temperature change.

A semiconductor apparatus according to the present invention can be applied to a semiconductor apparatus which is used in an AC-DC converter, and in particular, to a semiconductor apparatus for automotive use, which includes a semiconductor chip composing an AC-DC converter that converts an alternating-current power output from an alternator into a direct-current power and requires the long thermal fatigue life against temperature change to the semiconductor apparatus.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor apparatus including a semiconductor chip, a lead electrode and a support electrode comprising: a second thermal stress relaxation body arranged between the semiconductor chip and the lead electrode; jointing members respectively placed between the second thermal stress relaxation body and the semiconductor chip and between the second thermal stress relaxation body and the lead electrode, while making the second thermal stress relaxation body connected to the lead electrode; a first thermal stress relaxation body arranged between the semiconductor chip and the support electrode; jointing members respectively placed between the first thermal stress relaxation body and the semiconductor chip and between the first thermal stress relaxation body and the support electrode, while making the first thermal stress relaxation body connected to the support electrode; wherein the second thermal stress relaxation body is comprised of a material which has a thermal expansion coefficient in between the thermal expansion coefficients of the semiconductor chip and the lead electrode, and the first thermal stress relaxation body is comprised of a material which has a thermal expansion coefficient in between the thermal expansion coefficients of the semiconductor chip and the support electrode, and has a thermal conductivity of 50 to 300 W/(m·° C.).

2. A semiconductor apparatus including a semiconductor chip, a lead electrode and a support electrode comprising: a jointing member placed in between the semiconductor chip and the lead electrode to joint the semiconductor chip with the lead electrode; a first thermal stress relaxation body arranged in between the semiconductor chip and the support electrode; and jointing members respectively placed between the first thermal stress relaxation body and the semiconductor chip and between the first thermal stress relaxation body and the support electrode, while making the first thermal stress relaxation body connected to the support electrode, wherein the first thermal stress relaxation body is comprised of a material which has a thermal expansion coefficient in between the coefficients of the semiconductor chip and the support electrode, and has a thermal conductivity of 50 to 300 W/(m·° C.),
wherein the support electrode body includes a recess formed therein, the recess accommodating the semiconductor chip, wherein the first thermal stress relaxation body is arranged in adjacent to a lower part of the semiconductor chip, and wherein the recess is filled with a sealing material.

3. The semiconductor apparatus according to claim 1 or claim 2, wherein the first thermal stress relaxation body is comprised of a molybdenum material or a clad material of molybdenum and copper having a thermal expansion coefficient of 5 to $11 \times 10^{-6}$ (1/° C.) and a conductivity of 50 to 300 W/(m·° C.).

4. The semiconductor apparatus according to claim 1 or claim 2, wherein the first thermal stress relaxation body is comprised of a clad material of copper/Fe-Ni alloy/copper, which has a thermal expansion coefficient of 5 to $11 \times 10^{-6}$ (1/° C.) and has a conductivity of 50 to 300 W/(m·° C.).

5. The semiconductor apparatus according to claim 1, wherein the second thermal stress relaxation body is comprised of a molybdenum material having a thermal expansion coefficient of 3 to $9 \times 10^{-6}$ (1/° C.).

6. The semiconductor apparatus according to claim 1, wherein the support electrode body has a recess formed therein; the recess accommodating the semiconductor chip, and the second thermal stress relaxation body and the first thermal stress relaxation body arranged in the upper part and lower part of the semiconductor chip respectively, and filled with a resin.

7. The semiconductor apparatus according to claim 1 or claim 2, wherein the lead electrode is connected to a lead wire and the support electrode is connected to a radiator plate.

8. The semiconductor apparatus according to claim 1 or claim 2, wherein the semiconductor apparatus is configured to be used for converting an alternating-current power into a direct-current power.

9. The semiconductor apparatus according to claim 2, wherein the first thermal stress relaxation body is located in a lower portion of the recess, below the semiconductor chip.

10. The semiconductor apparatus according to claim 2, wherein the sealing material is comprised of a resin.

11. The semiconductor apparatus according to claim 10, wherein the resin is comprised of silicon rubber.

* * * * *